(12) United States Patent
Peng et al.

(10) Patent No.: US 9,401,694 B2
(45) Date of Patent: Jul. 26, 2016

(54) OPERATIONAL TRANSCONDUCTANCE AMPLIFIER, OPERATIONAL TRANSCONDUCTANCE AMPLIFIER-CAPACITOR FILTER AND HIGH ORDER RECONFIGURABLE ANALOG FILTER

(71) Applicant: National Taiwan University of Science and Technology, Taipei (TW)

(72) Inventors: Sheng-Yu Peng, Taipei (TW); Hung-Yu Shih, Taipei (TW); Min-Rui Lai, Taipei (TW); Chiang-His Lee, Taipei (TW); Tzu-Yun Wang, Taipei (TW)

(73) Assignee: NATIONAL TAIWAN UNIVERSITY OF SCIENCE AND TECHNOLOGY, Taipei (TW)

( * ) Notice: Subject to any disclaimer, the term of this patent is extended or adjusted under 35 U.S.C. 154(b) by 36 days.

(21) Appl. No.: 14/453,631

(22) Filed: Aug. 7, 2014

(65) Prior Publication Data

US 2015/0200648 A1 Jul. 16, 2015

(30) Foreign Application Priority Data

Jan. 16, 2014 (TW) .............................. 103101644 A

(51) Int. Cl.
*G06G 7/26* (2006.01)
*H03H 11/04* (2006.01)
(Continued)

(52) U.S. Cl.
CPC ......... *H03H 11/0422* (2013.01); *H03F 1/0205* (2013.01); *H03F 1/3211* (2013.01);
(Continued)

(58) Field of Classification Search
CPC .. H03F 3/45475; H03F 3/45183; H04B 17/14
See application file for complete search history.

(56) References Cited

U.S. PATENT DOCUMENTS

| 5,612,648 A | 3/1997 | McClellan et al. |
| 6,377,070 B1* | 4/2002 | Forbes ................... H01L 27/115 |
| | | 257/E21.422 |

(Continued)

FOREIGN PATENT DOCUMENTS

TW 201004139 A 1/2010

OTHER PUBLICATIONS

P. M. Furth, H. A. Ommani, "Low-Voltage Highly-Linear Transconductor Design in Subthreshold CMOS" Proceedings of the 40th Midwest Symposium on Circuits and Systems, vol. 1, pp. 156-159, Aug. 1997.

(Continued)

*Primary Examiner* — Sibin Chen
(74) *Attorney, Agent, or Firm* — CKC & Partners Co., Ltd.

(57) ABSTRACT

An operational transconductance amplifier includes a fully-differential amplifying circuit, a bias driving circuit, and a common mode feedback circuit. The fully-differential amplifying circuit is configured for receiving a differential input voltage and providing a differential output voltage. The fully-differential amplifying circuit includes a plurality of diffusor-differential-pair circuits. The bias driving circuit is configured for providing at least one first bias current to drive the fully-differential amplifying circuit and adjust the transconductance of the transconductance amplifier. The common mode feedback circuit is configured for stabilizing the differential output voltage. An operational transconductance amplifier-capacitor (OTA-C) filter and a high order filter are disclosed herein as well.

17 Claims, 7 Drawing Sheets

(51) Int. Cl.
  *H03F 1/02* (2006.01)
  *H03F 1/32* (2006.01)
  *H03F 3/45* (2006.01)

(52) U.S. Cl.
  CPC .......... *H03F3/4565* (2013.01); *H03F 3/45183* (2013.01); *H03F 3/45237* (2013.01); *H03H 11/0433* (2013.01); *H03H 11/0472* (2013.01); *H03F 2203/45134* (2013.01); *H03F 2203/45288* (2013.01)

(56) References Cited

U.S. PATENT DOCUMENTS

| | | | |
|---|---|---|---|
| 6,972,625 | B2 | 12/2005 | Nguyen et al. |
| 7,212,068 | B2 | 5/2007 | Onody |
| 7,586,366 | B2 * | 9/2009 | Kimura .................. H03H 11/04 327/552 |
| 2011/0025411 | A1 | 2/2011 | Piazza et al. |
| 2014/0176239 | A1 * | 6/2014 | Duggal ............... H03F 3/45744 330/260 |

OTHER PUBLICATIONS

R. Chawla, F. Adil, G. Serrano, P. E. Hasler, "Programmable Gm-C Filters Using Floating-Gate Operational Transconductance Amplifiers," IEEE Transactions on Circuits and Systems I: Regular Papers, vol. 54, pp. 481-491, Mar. 2007.

Shuenn-Yuh Lee, Chih-Jen Cheng,"Systematic Design and Modeling of a OTA-C Filter for Portable ECG Detection" IEEE Transactions on Circuits and Systems, vol. 3, No. 1, pp. 53-64, Feb. 2009.

M. Tavakoli; R. Sarpeshkar, "A sinh Resistor and Its Application to tanh Linearization," IEEE Journal of Solid-State Circuits vol. 40, No. 2, pp. 536-543, Feb. 2005.

T. S. Lee; H. Y. Chung; S. M. Cai, "Design Techniques for Low-Voltage Fully Differential CMOS Switched-Capacitor Amplifiers," in Circuits and Systems, 2006. ISCAS 2006. Proceedings. 2006 IEEE International Symposium pp. 2825-2828, May 21-24, 2006.

F. Munoz; A. Torralba; R.G. Carvajal; J. Ramirez-Angulo, "Tunable CMOS Low-Voltage Linear Transconductor and Its Application to HF GM-C filter design," in Circuits and Systems, 1999. 42nd Midwest Symposium on, vol. 2, No., pp. 826-829 vol. 2, 1999.

Y. Tsividis, "Integrated Continuous-Time Filter Design—An Overview," in IEEE Journal of Solid-State Circuits, vol. 29, No. 3, pp. 166-176, Mar. 1994.

P.M. Furth; A.G. Andreou, "Linearised Differential Transconductors in Subthreshold CMOS," in Electronics Letters, vol. 31, No. 7, pp. 545-547, Mar. 30, 1995.

* cited by examiner

OPERATIONAL TRANSCONDUCTANCE AMPLIFIER, OPERATIONAL TRANSCONDUCTANCE AMPLIFIER-CAPACITOR FILTER AND HIGH ORDER RECONFIGURABLE ANALOG FILTER

RELATED APPLICATIONS

This application claims priority to Taiwan Application Serial Number 103101644, filed Jan. 16, 2014, the entirety of which is herein incorporated by reference.

BACKGROUND

1. Technical Field

The present disclosure relates to a reconfigurable high order filter. More particularly, the present disclosure relates to an operational transconductance amplifier comprised in a high order filter.

2. Description of Related Art

Filter is a component widely used in electronic devices. A sensing component of an electronic device detects a signal from a natural environment or an organism, in which the signal is usually mixed with other undesired signals or noises. A filter is then utilized to remove the noises and acquire the signal within a specific frequency range.

In the application of low-power consumption and high-accuracy electronic devices such as portable or implantable biomedical detecting apparatuses, the filters however still need significant improvement in power consumption, accuracy and dynamic range.

SUMMARY

In one aspect, the present disclosure is related to an operational transconductance amplifier. The operational transconductance amplifier includes a fully-differential amplifying circuit, a bias driving circuit, and a common mode feedback circuit. The fully-differential amplifying circuit is configured for receiving a differential input voltage and providing a differential output voltage. The fully-differential amplifying circuit includes a plurality of diffusor-differential-pair circuits. The bias driving circuit is configured for providing at least one first bias current to drive the fully-differential amplifying circuit and adjust the transconductance of the transconductance amplifier. The common mode feedback circuit is configured for stabilizing the differential output voltage.

In another aspect, the present disclosure is related to an operational transconductance amplifier-capacitor (OTA-C) filter. The operational transconductance amplifier-capacitor filter includes a plurality of electrically connected operational transconductance amplifiers and a plurality of capacitors. Each of the operational transconductance amplifiers includes a fully-differential amplifying circuit, a bias driving circuit and a common mode feedback circuit. The fully-differential amplifying circuit is configured for receiving a differential input voltage and for providing a differential output voltage, in which the fully-differential amplifying circuit includes a plurality of diffusor-differential-pair circuits. The bias driving circuit is electrically connected with the fully-differential amplifying circuit. The bias driving circuit is configured for providing at least one first bias current to drive the fully-differential amplifying circuit and adjust the transconductance of the operational transconductance amplifier. The common mode feedback circuit is electrically connected with the fully-differential amplifying circuit. The common mode feedback circuit is configured for stabilizing the differential output voltage.

In still another aspect, the present disclosure is related to a high order filter. The high order filter includes a plurality of cascadable operational transconductance amplifier-capacitor filters and a control module. Each of the operational transconductance amplifier-capacitor filters includes a plurality of electrically connected operational transconductance amplifiers and a plurality of capacitors, in which each of the operational transconductance amplifiers includes a fully-differential amplifying circuit, a bias driving circuit and a common mode feedback circuit. The fully-differential amplifying circuit is configured for receiving a differential input voltage and for providing a differential output voltage, in which the fully-differential amplifying circuit includes a plurality of diffusor-differential-pair circuits. The bias driving circuit is electrically connected with the fully-differential amplifying circuit. The bias driving circuit is configured for providing at least one first bias current to drive the fully-differential amplifying circuit and adjust the transconductance of the operational transconductance amplifier. The common mode feedback circuit is electrically connected with the fully-differential amplifying circuit. The common mode feedback circuit is configured for stabilizing the differential output voltage. The control module is configured for con oiling the operational transconductance amplifier-capacitor filters to be selectively cascaded according to an external signal.

Compared with prior arts, in the present disclosure, by deploying a plurality of diffusor-differential-pair circuits in the operational transconductance amplifier, the linear range of the operational transconductance amplifier is significantly improved. Consequently, the distortion of the outputted signals is reduced and the dynamic ranges of the operational transconductance amplifiers and of the operational transconductance amplifier-capacitor filter consisting of the operational transconductance amplifiers herein are improved. Moreover, by deploying the bias driving circuit and the common mode feedback circuit consisting of floating-gate transistors, the power consumed by the operational transconductance amplifier is reduced, and the bias driving current provided in this manner is more precise. Consequently, the performance of the operational transconductance amplifier-capacitor filter consisting of the operational transconductance amplifiers herein is improved. Also, the transconductance value of the operational transconductance amplifier can be adjusted by configuring the floating-gate transistors of the bias driving circuit and of the common mode feedback circuit.

Furthermore, by utilizing a reconfigurable circuit, a high order filter is realized by cascading a plurality of operational transconductance amplifier-capacitor filters. In the proposed high order filter, cascadable operational transconductance amplifier-capacitor filters can be selected to be cascaded according to practical needs. The operational transconductance amplifier-capacitor filters which are not selected to be cascaded do not consume power, and each of the operational transconductance amplifier-capacitor filters can comprise the low power and high dynamic range operational transconductance amplifiers proposed in the present disclosure. By adjusting the transconductance values of the operational transconductance amplifiers, the output gain, the central frequency and the quality factor of the operational transconductance amplifier-capacitor filters and of the abovementioned high order filter can be adjusted accordingly.

These and other features, aspects, and advantages of the present disclosure will become better understood with reference to the following description and appended claims.

It is to be understood that both the foregoing general description and the following detailed description are by examples, and are intended to provide further explanation of the disclosure as claimed.

BRIEF DESCRIPTION OF THE DRAWINGS

The disclosure can be more fully understood by reading the following detailed description of the embodiment, with reference made to the accompanying drawings as follows.

DETAILED DESCRIPTION

Figure 1:
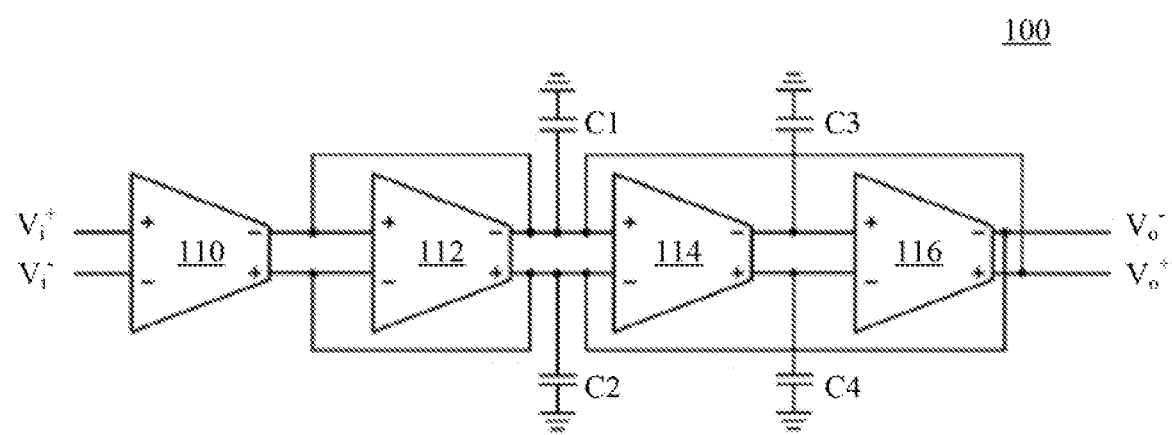
FIG. 1 is a schematic diagram of a block diagram of an operational transconductance amplifier-capacitor (OTA-C) filter in accordance with one embodiment of the present disclosure.

Reference will now be made in detail to the present embodiments of the disclosure, examples of which are illustrated in the accompanying drawings. Wherever possible, the same reference numbers are used in the drawings and the description to refer to the same or like parts.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

In the following description and claims, the terms "coupled" and "connected", along with their derivatives, may be used. In particular embodiments, "connected" and "coupled" may be used to indicate that two or more elements are in direct physical or electrical contact with each other, or may also mean that two or more elements may be in indirect contact with each other. "Coupled" and "connected" may still be used to indicate that two or more elements cooperate or interact with each other.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising", or "includes" and/or "including" or "has" and/or "having" when used in this specification, specify the presence of stated features, regions, integers, steps, operations, elements, and/or components, but do not preclude the presence or addition of one or more other features, regions, integers, steps, operations, elements, components, and/or groups thereof.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present invention.

Reference is made first to FIG. 1. FIG. 1 is a block diagram of an operational transconductance amplifier-capacitor (OTA-C) filter 100 in accordance with one embodiment of the present disclosure.

The operational transconductance amplifier-capacitor filter 100 includes four electrically connected operational transconductance amplifiers 110, 112, 114, 116, and four capacitors C1, C2, C3, C4. The operational transconductance amplifier 110 is configured for receiving a differential input voltage $V_i^+$ and $V_i^-$, and for providing a differential voltage to the operational transconductance amplifier 112. The operational transconductance amplifier 112 is configured for receiving the differential voltage outputted by the operational transconductance amplifier 110, and for providing a differential voltage to the operational transconductance amplifier 114. As illustrated in FIG. 1, feedback routes are deployed between the output nodes and the input nodes of the operational transconductance amplifier 112, and the output nodes of the operational transconductance amplifier 112 are electrically connected with the capacitors C1 and C2. The operational transconductance amplifier 114 is configured for receiving the differential voltage outputted by the operational transconductance amplifier 112, and for providing a differential voltage to the operational transconductance amplifier 116. The output nodes of the operational transconductance amplifier 114 are electrically connected with the capacitors C3 and C4. The operational transconductance amplifier 116 is configured for receiving the differential voltage outputted by the operational transconductance amplifier 114, and for providing a differential output voltage $V_o^+$ and $V_o^-$. As illustrated in FIG. 1, feedback routes are deployed between the output nodes of the operational transconductance amplifier 116 and the input nodes of the operational transconductance amplifier 114.

The operational transconductance amplifier 110 is configured for providing output gain for the operational transconductance amplifier-capacitor filter 100. The operational transconductance amplifiers 112, 114 and 116 are configured for determining the central frequency and the bandwidth of the operational transconductance amplifier-capacitor filter 100. In the present embodiment, the transconductance of the operational transconductance amplifiers 110, 112, 114 and 116 can be adjusted to change the output gain, the central frequency and the bandwidth of the operational transconductance amplifier-capacitor filter 100 according to practical needs.

It is noted that the number of the operational transconductance amplifiers deployed in the operational transconductance amplifier-capacitor filter 100 is not limited to four. FIG. 1 is a diagram for illustration, and the present disclosure is not limited thereto. As another example, the operational transconductance amplifier 110 can be omitted if the output gain of the operational transconductance amplifier-capacitor filter 100 is not required to be adjusted.

In the present embodiment, the operational transconductance amplifier-capacitor filter 100 is a bandpass filter. However, the waveform of the outputted signal can be changed by changing the output nodes of the differential output voltage (please refer to the following paragraph and FIG. 2).

Figure 2:
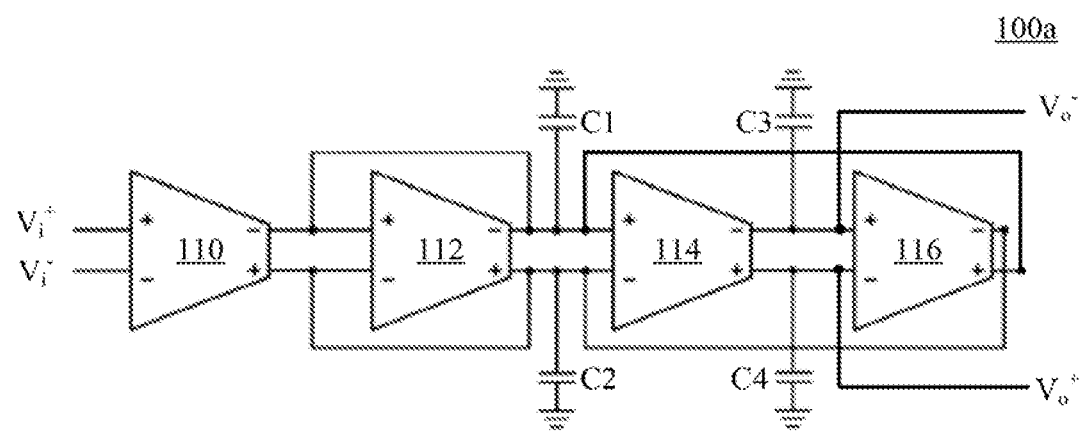
FIG. 2 is a schematic diagram of a block diagram of an operational transconductance amplifier-capacitor filter in accordance with one embodiment of the present disclosure.

Reference is made also to FIG. 2. FIG. 2 is a block diagram of an operational transconductance amplifier-capacitor filter 100a in accordance with one embodiment of the present disclosure. Comparing with the operational transconductance amplifier-capacitor filter 100 illustrated in FIG. 1, the differential output voltage $V_o^+$ and $V_o$ in this embodiment is provided by the operational transconductance amplifier 114. Consequently, the operational transconductance amplifier-capacitor filter 100a is realized as a lowpass filter.

Figure 3:
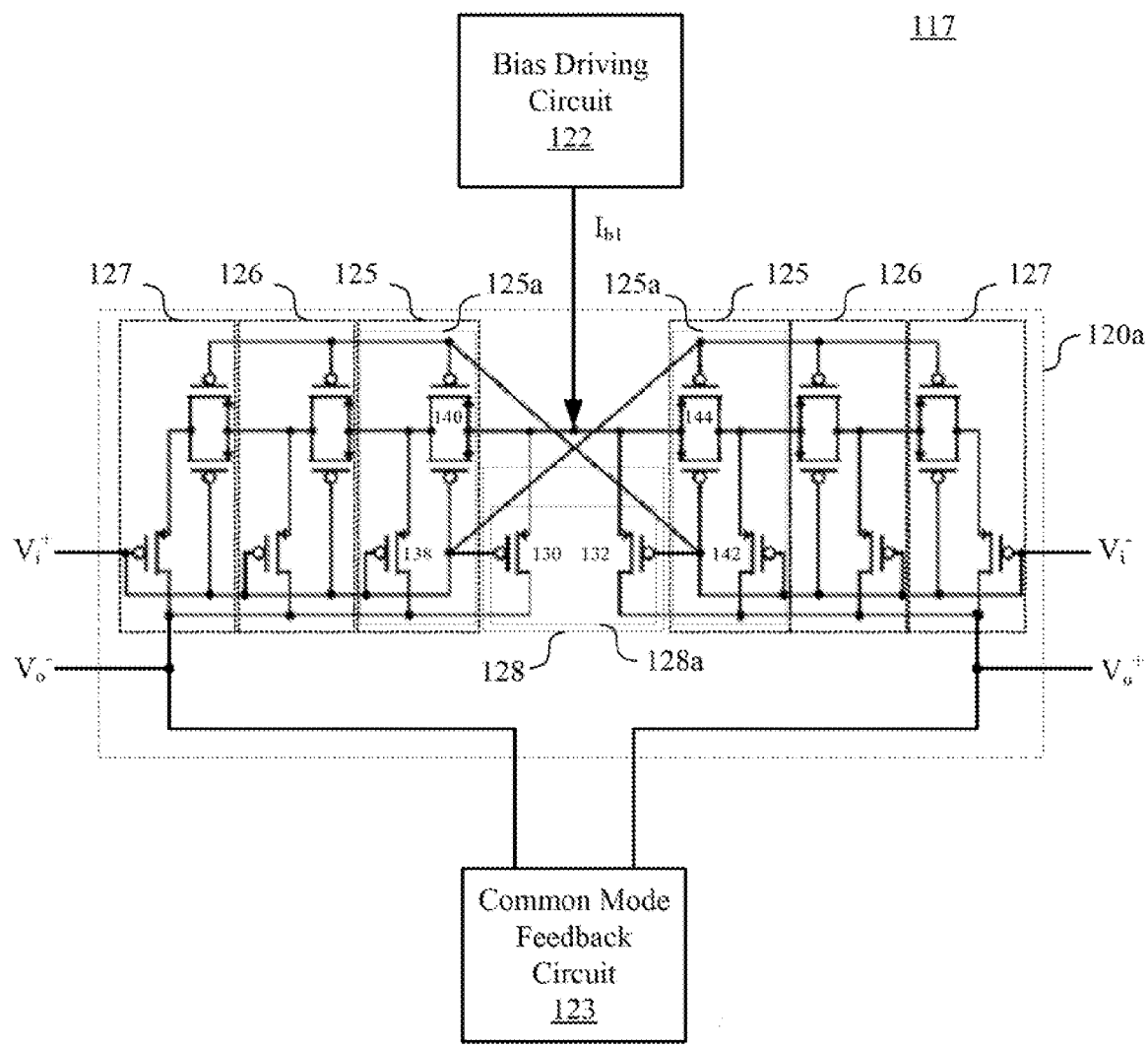
FIG. 3 is a circuit diagram of an operational transconductance amplifier in accordance with one embodiment of the present disclosure.

Additional reference is made to FIG. 3. FIG. 3 is a circuit diagram of an operational transconductance amplifier 117 in accordance with one embodiment of the present disclosure. The operational transconductance amplifier 117 can be applied in the operational transconductance amplifier 110, 112, 114 or 116 illustrated in FIG. 1 and FIG. 2.

The operational transconductance amplifier 117 includes a fully-differential amplifying circuit 120a, a bias driving circuit 122, and a common mode feedback circuit 123.

The bias driving circuit 122 is electrically connected with the fully-differential amplifying circuit 120. The bias driving circuit 122 is configured for providing at least one first bias current $I_{b1}$ to drive the fully-differential amplifying circuit 120a, in which the first bias current $I_{b1}$ can be adjusted such that the transconductance of the transconductance amplifier 117 changes accordingly.

The fully-differential amplifying circuit 120a is configured for receiving a differential input voltage $V_i^+$ and $V_i^-$, and for providing a differential output voltage $V_o^+$ and $V_o^-$. The fully-differential amplifying circuit 120a can selectively includes a differential-pair circuit 128.

The differential-pair circuit 128 includes a differential-pair unit 128a, in which the differential-pair unit 128a includes PMOS transistors 130 and 132.

The gates of the PMOS transistor 130 and of the PMOS transistor 132 are configured for receiving the differential input voltage $V_i^+$ and $V_i^-$, respectively. The drains of the PMOS transistor 130 and of the PMOS transistor 132 are configured for providing the differential output voltage $V_o^-$ and $V_o^+$, respectively. The sources of the PMOS transistor 130 and of the PMOS transistor 132 are configured for receiving the first bias current $I_{b1}$.

It has to be explained that the differential-pair circuit 128 is selectively deployed in the fully-differential amplifying circuit 120a. The differential-pair circuit 128 is configured for improving the linear range of the transconductance amplifier 117. Persons skilled in the art can omit the deployment of the differential-pair circuit 128 according to practical needs.

The fully-differential amplifying circuit 120a further includes three diffusor-differential-pair circuits 125, 126 and 127. The diffusor-differential-pair circuit 125 includes a diffusor-differential-pair unit 125a.

The diffusor-differential-pair unit 125a includes diffusor-pair units 140, 144, and a differential-pair unit (PMOS transistors 138 and 142).

Each of the diffusor-pair units 140 and 144 includes two PMOS transistors, in which the sources of the PMOS transistors are electrically connected, and the drains of the PMOS transistors are electrically connected.

As the connection relationships illustrated in FIG. 3, the gates of the PMOS transistors in the diffusor-pair units 140 and 144 are configured for receiving the differential input voltage $V_i^+$ and $V_i^-$, and are electrically connected with the gates of the PMOS transistors 130 and 132 in the differential-pair circuit 128. The sources of the PMOS transistors in the diffusor-pair units 140 and 144 are configured for receiving the first bias current $I_{b1}$, and are electrically connected with the sources of the PMOS transistors 130 and 132 in the differential-pair circuit 128.

As the connection relationships illustrated in FIG. 3, the gates of the PMOS transistors 138 and 142 are configured for receiving the differential input voltage $V_i^+$ and $V_i^-$, and are electrically connected with the gates of the PMOS transistors in the diffusor-pair units 140 and 144, and with the gates of the PMOS transistors 130 and 132.

The sources of the PMOS transistors 138 and 142 are electrically connected with the drains the PMOS transistors in the diffusor-pair units 140 and 144, respectively. The drains of the PMOS transistors 138 and 142 are configured for providing the differential output voltage $V_o^-$ and $V_o^+$, and are electrically connected with the drains of the PMOS transistors 130 and 132, respectively.

The elements and connection relationships in the diffusor-differential-pair circuits 126 and 127 are as illustrated in FIG. 3, which are similar to the elements and connection relationships in the diffusor-differential-pair circuit 125 and hence are not described again herein.

The common mode feedback circuit 123 is electrically connected with the fully-differential amplifying circuit 120a. The common mode feedback circuit 123 is configured for stabilizing the differential output voltage $V_o^+$ and $V_o^-$, so that the transistors in the fully-differential amplifying circuit 120a work stably within preferred operation regions.

Figure 4:
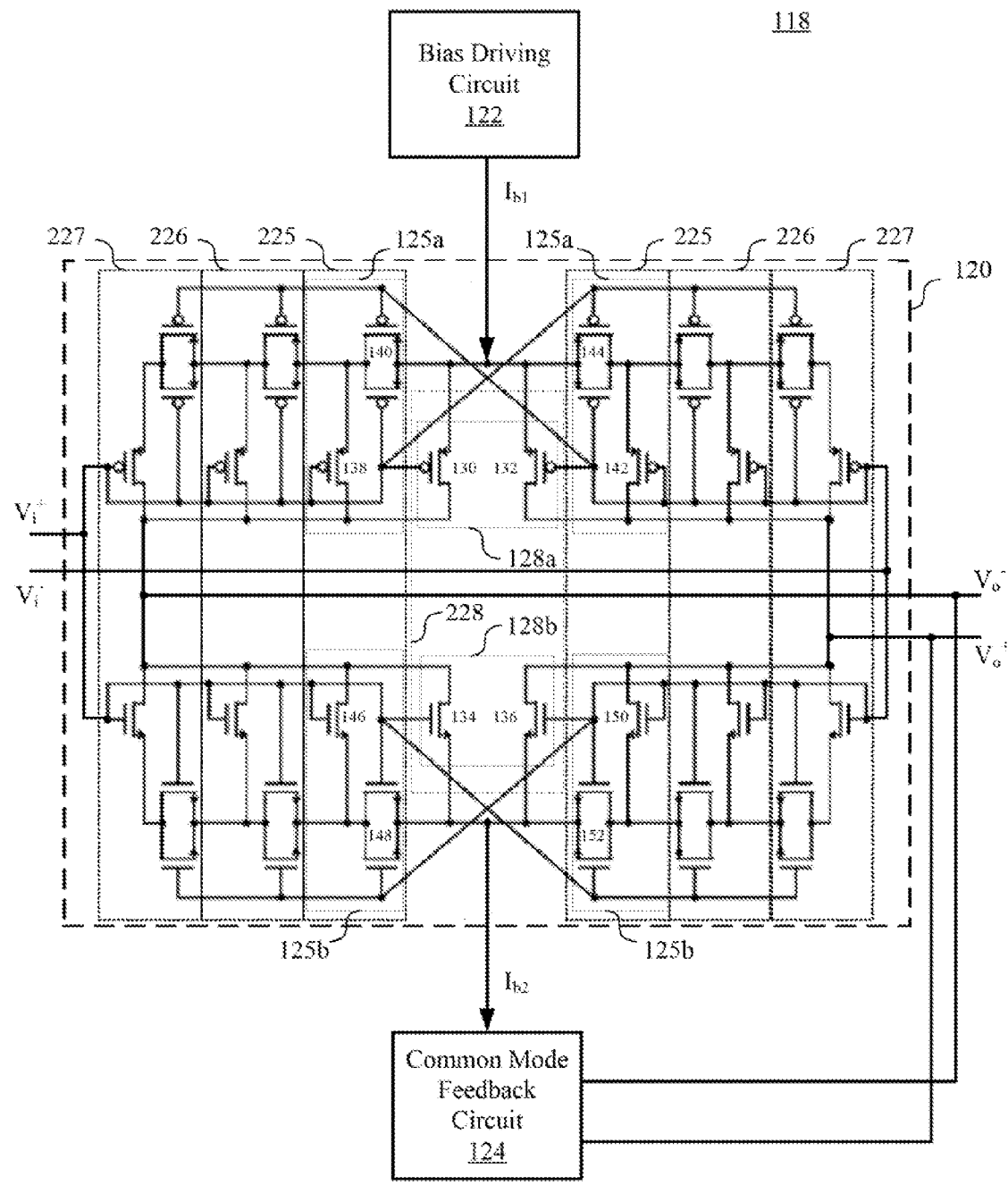
FIG. 4 is a circuit diagram of an operational transconductance amplifier in accordance with one embodiment of the present disclosure.

Reference is now made to FIG. 4. FIG. 4 is a circuit diagram of an operational transconductance amplifier 118 in accordance with one embodiment of the present disclosure. The operational transconductance amplifier 118 can be applied in the operational transconductance amplifier 110, 112, 114 or 116 illustrated in FIG. 1 and FIG. 2.

The operational transconductance amplifier 118 includes fully-differential amplifying circuit 120, a bias driving circuit 122, and a common mode feedback circuit 124.

The bias driving circuit 122 is electrically connected with the fully-differential amplifying circuit 120. The bias driving circuit 122 is configured for providing at least one first bias current $I_{b1}$ to drive the fully-differential amplifying circuit 120, in which the first bias current $I_{b1}$ can be adjusted such that the transconductance of the operational transconductance amplifier 118 changes accordingly.

The fully-differential amplifying circuit 120 is configured for receiving a differential input voltage $V_i^+$ and $V_i^-$, and for providing a differential output voltage $V_o^+$ and $V_o^-$. The fully-differential amplifying circuit 120 can selectively includes a differential-pair circuit 228.

The differential-pair circuit 228 includes two cascode differential-pair units 128a and 128b, in which the differential-pair unit 128a is as illustrated in the embodiment shown in FIG. 3 and hence is not described again herein. The differential-pair unit 128b includes NMOS transistors 134 and 136.

The gates of the NMOS transistor 134 and of the NMOS transistor 136 are configured for receiving the differential input voltage $V_i^+$ and $V_i^-$, respectively. The drains of the NMOS transistor 134 and of the NMOS transistor 136 are configured for providing the differential output voltage $V_o^-$ and $V_o^+$, respectively. The sources of the NMOS transistor 134 and of the NMOS transistor 136 are configured for providing the second bias current $I_{b2}$.

It has to be explained that the differential-pair circuit 228 is selectively deployed in the fully-differential amplifying circuit 120. The differential-pair circuit 228 is configured for improving the linear range of the transconductance amplifier 118. Persons skilled in the art can omit the deployment of the differential-pair circuit 228 according to practical needs.

The fully-differential amplifying circuit 120 further includes three diffusor-differential-pair circuits 225, 226 and 227. The diffusor-differential-pair circuit 225 includes two cascode diffusor-differential-pair units 125a and 125b, in which the diffusor-differential-pair units 125a is as illustrated in the embodiment shown in FIG. 3 and hence is not described again herein. The diffusor-differential-pair unit 125b includes diffusor-pair units 148, 152, and a differential-pair unit (NMOS transistors 146 and 150).

Each of the diffusor-pair units 148 and 152 includes two NMOS transistors, in which the sources of the NMOS transistors are electrically connected, and the drains of the NMOS transistors are electrically connected.

As the connection relationships illustrated in FIG. 4, the gates of the NMOS transistors in the diffusor-pair units 148 and 152 are configured for receiving the differential input voltage $V_i^+$ and $V_i^-$, and are electrically connected with the gates of the NMOS transistors 134 and 136 in the differential-pair circuit 228. The sources of the NMOS transistors in the diffusor-pair units 148 and 152 are configured for outputting the second bias current $I_{b2}$, and are electrically connected with the sources of the NMOS transistors 134 and 136 in the differential-pair circuit 128.

As the connection relationships illustrated in FIG. 4, the gates of the NMOS transistors 146 and 150 are configured for receiving the differential input voltage $V_i^+$ and $V_i^-$, and are electrically connected with the gates of the NMOS transistors in the diffusor-pair units 148 and 152, and with the gates of the NMOS transistors 134 and 136.

The sources of the NMOS transistors 146 and 150 are electrically connected with the drains of the NMOS transistors in the diffusor-pair units 148 and 152, respectively. The drains of the NMOS transistors 146 and 150 are configured for providing the differential output voltage $V_o^-$ and $V_o^+$, and are electrically connected with the drains of the NMOS transistors 134 and 136, respectively.

The elements and connection relationships in the diffusor-differential-pair circuits 226 and 227 are as illustrated in FIG. 4, which are similar to the elements and connection relationships in the diffusor-differential-pair circuit 225 and hence are not described again herein.

The common mode feedback circuit 124 is electrically connected with the fully-differential amplifying circuit 120. The common mode feedback circuit 124 is configured receiving the differential output voltage $V_o^+$ and $V_o^-$, and for adjusting the second bias current $I_{b2}$ according to the output voltage $V_o^+$ and $V_o^-$, so that the second bias current $I_{b2}$ is equal to the first bias current $I_{b1}$. Consequently, the differential output voltage $V_o^+$ and $V_o^-$ is stabilized and the transistors in the fully-differential amplifying circuit 120 work stably within preferred operation regions.

The transconductance of the operational transconductance amplifier 118 is determined by the first bias current $I_{b1}$ provided by the bias driving circuit 122. When the first bias current $I_{b1}$ increases, the transconductance of the operational transconductance amplifier 118 increases accordingly. Every operational transconductance amplifier has a maximum transconductance value under a fixed bias driving current. The linear range of an operational transconductance amplifier is defined herein as the range of input voltage values where the difference between the actual transconductance values of the output signals and the maximum transconductance value is smaller or equal to 1% when different differential signals are inputted into the operational transconductance amplifier.

A common drawback of conventional operational transconductance amplifiers which are designed to work in sub-threshold region is that the linear ranges are usually small. Therefore, the outputted signals are distorted and the dynamic ranges of the operational transconductance amplifiers and of the operational transconductance amplifier-capacitor filter consisting of the operational transconductance amplifiers are poor. The linear range of the operational transconductance amplifier 118 is significantly improved by deploying the three diffusor-differential-pair circuits 225, 226 and 227.

The Linear Efficiency Factor (LEF) of an operational transconductance amplifier is defined herein as:

$$LEF = \frac{I}{LR \times G_{m,max}},$$

in which LR is the linear range of the operational transconductance amplifier under a bias driving current I, and $G_{m,max}$ is the maximum transconductance value of the operational transconductance amplifier under a bias driving current with current value I. Therefore, the lower the LEF of an operational transconductance amplifier is, the more efficient the employment of the bias driving current in the operational transconductance amplifier is. The LEF of an operational transconductance amplifier can be regarded as an indicator for evaluating the efficiency of the operational transconductance amplifier. It is shown on computer simulations that the LEF of the operational transconductance amplifier 118 is smaller than one tenth of the LEF of conventional operational transconductance amplifiers which are not deployed with diffusor-differential-pair circuits.

It is noted that the number of the diffusor-differential-pair circuits deployed in the operational transconductance amplifier 117 or 118 is not limited to three. The more the diffusor-differential-pair circuits are deployed, the lower the LEF of an operational transconductance amplifier is.

In another embodiment of the present disclosure (not depicted), the circuit structure of an operational transconductance amplifier is similar to the circuit structure of the operational transconductance amplifier 117, and the operational transconductance amplifier is deployed with two diffusor-differential-pair circuits. In still another embodiment of the present disclosure (not depicted), the circuit structure of an operational transconductance amplifier is similar to the circuit structure of the operational transconductance amplifier 118, and the operational transconductance amplifier is deployed with four diffusor-differential-pair circuits.

It is noted that the location of the bias driving circuit 122 and the location of the common mode feedback circuit 124 can be exchanged. In another embodiment of the present disclosure (not depicted), an operational transconductance amplifier is employed with a bias driving circuit located under a fully-differential amplifying circuit to provide a second bias current $I_{b2}$ to drive the fully-differential amplifying circuit. The operational transconductance amplifier is also employed with a common mode feedback circuit located above the fully-differential amplifying circuit to receive the differential output voltage $V_o^+$ and $V_o^-$, and to adjust a first bias current $I_{b1}$ according to the output voltage $V_o^+$ and $V_o^-$, so that the first bias current $I_{b1}$ is equal to the second bias current $I_{b2}$. Consequently, the differential output voltage $V_o^+$ and $V_o^-$ is stabilized and the transistors in the fully-differential amplifying circuit work stably within preferred operation regions.

Moreover, the deployment of the upper part of the fully-differential amplifying circuit 120 illustrated in FIG. 4 (i.e., the fully-differential amplifying circuit 120a illustrated in FIG. 3) can be omitted. In another embodiment of the present disclosure (not depicted), the circuit structure of an operational transconductance amplifier is similar to the circuit structure of the operational transconductance amplifier 118 illustrated in FIG. 4. The fully-differential amplifying circuit of the operational transconductance amplifier comprises the lower part of the fully-differential amplifying circuit 120 (i.e., the fully-differential amplifying circuit comprises NMOS transistors). In this embodiment, the operational transconductance amplifier is employed with a bias driving circuit located under the fully-differential amplifying circuit comprising NMOS transistors to provide a second bias current $I_{b2}$ to drive the fully-differential amplifying circuit. The operational transconductance amplifier is also employed with a common mode feedback circuit located above the fully-differential amplifying circuit comprising NMOS transistors to receive the differential output voltage $V_o^+$ and $V_o^-$, and to adjust a first bias current according to the output voltage $V_o^+$ and $V_o^-$, so that the first bias current $I_{b1}$ is equal to the second bias current $I_{b2}$. Consequently, the differential output voltage $V_o^+$ and $V_o^-$ is stabilized and the transistors in the fully-differential amplifying circuit work stably within preferred operation regions.

Figure 5:
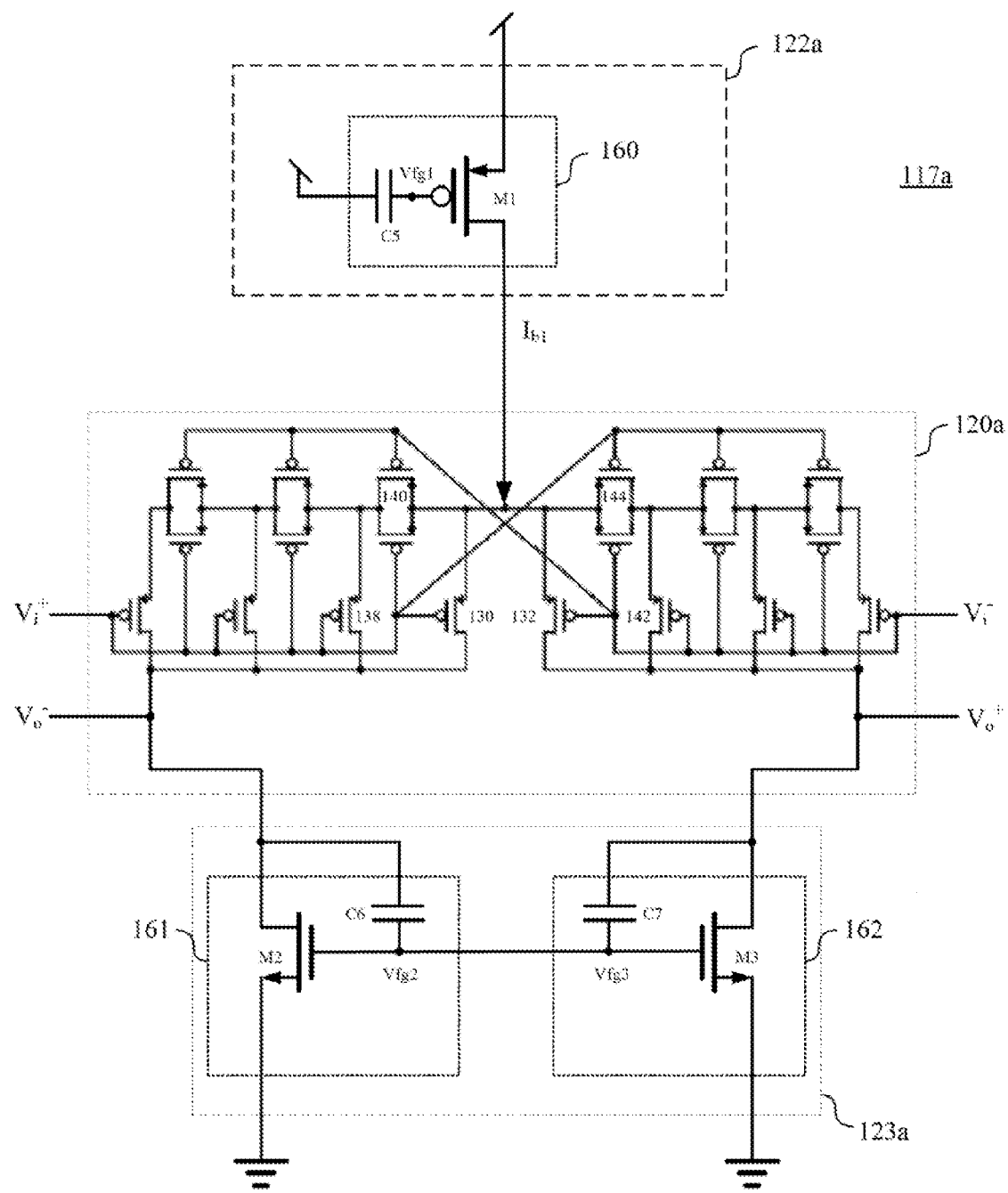
FIG. 5 is a circuit diagram of an operational transconductance amplifier in accordance with one embodiment of the present disclosure.

Reference is further made to FIG. 5. FIG. 5 is a circuit diagram of an operational transconductance amplifier 117a similar to the operational transconductance amplifier 117 illustrated in FIG. 3 in accordance with one embodiment of the present disclosure. The operational transconductance amplifier 117a can be applied in the operational transconductance amplifier 110, 112, 114 or 116 illustrated in FIG. 1 and FIG. 2.

The operational transconductance amplifier 117a includes fully-differential amplifying circuit 120a as illustrated in FIG. 3, a bias driving circuit 122a and a common mode feedback circuit 123a.

The bias driving circuit 122a of the operational transconductance amplifier 117a includes a PMOS floating-gate transistor 160. The PMOS floating-gate transistor 160 includes a coupling capacitor C5 and a transistor M1. By adjusting the electrical charges stored in the coupling capacitor C5 of the PMOS floating-gate transistor 160, the floating-gate voltage level $V_{fg1}$ of the transistor M1 changes accordingly. Consequently, the first bias current $I_{b1}$ changes accordingly, and the transconductance value of the operational transconductance amplifier 117a is adjusted.

Compared with conventional bias driving circuits which require reference current sources, in the present disclosure, by utilizing the PMOS floating-gate transistor 160, the currents consumed by the reference current sources in conventional bias driving circuits can be saved. Also, by adjusting the electrical charges stored in the coupling capacitor C5 of the PMOS floating-gate transistor 160 to change the floating-gate voltage level $V_{fg1}$ of the transistor M1 and the first bias current $I_{b1}$, the flexibility and accuracy are better than conventional bias driving circuits.

The common mode feedback circuit 123a of the operational transconductance amplifier 117a includes NMOS floating-gate transistors 161 and 162. The NMOS floating-gate transistor 161 includes a coupling capacitor C6 and a transistor M2. The NMOS floating-gate transistor 162 includes a coupling capacitor C7 and a transistor M3.

By adjusting the electrical charges stored in the coupling capacitors C6 and C7 according to the differential output voltage $V_o^+$ and $V_o^-$, the floating-gate voltage level $V_{fg2}$ of the transistor M2 and the floating-gate voltage level $V_{fg3}$ of the transistor M3 changes accordingly. Consequently, the DC voltage level of the differential output voltage $V_o^+$ and $V_o^-$ changes accordingly, so that the differential output voltage $V_o^+$ and $V_o^-$ is stabilized, and the transistors of the fully-differential amplifying circuit 120a work stably within preferred operation regions.

Compared with conventional common mode feedback circuits, in the present disclosure, by utilizing the NMOS floating-gate transistors 161 and 162, additional power consumed by conventional common mode feedback circuits is reduced.

Figure 6:
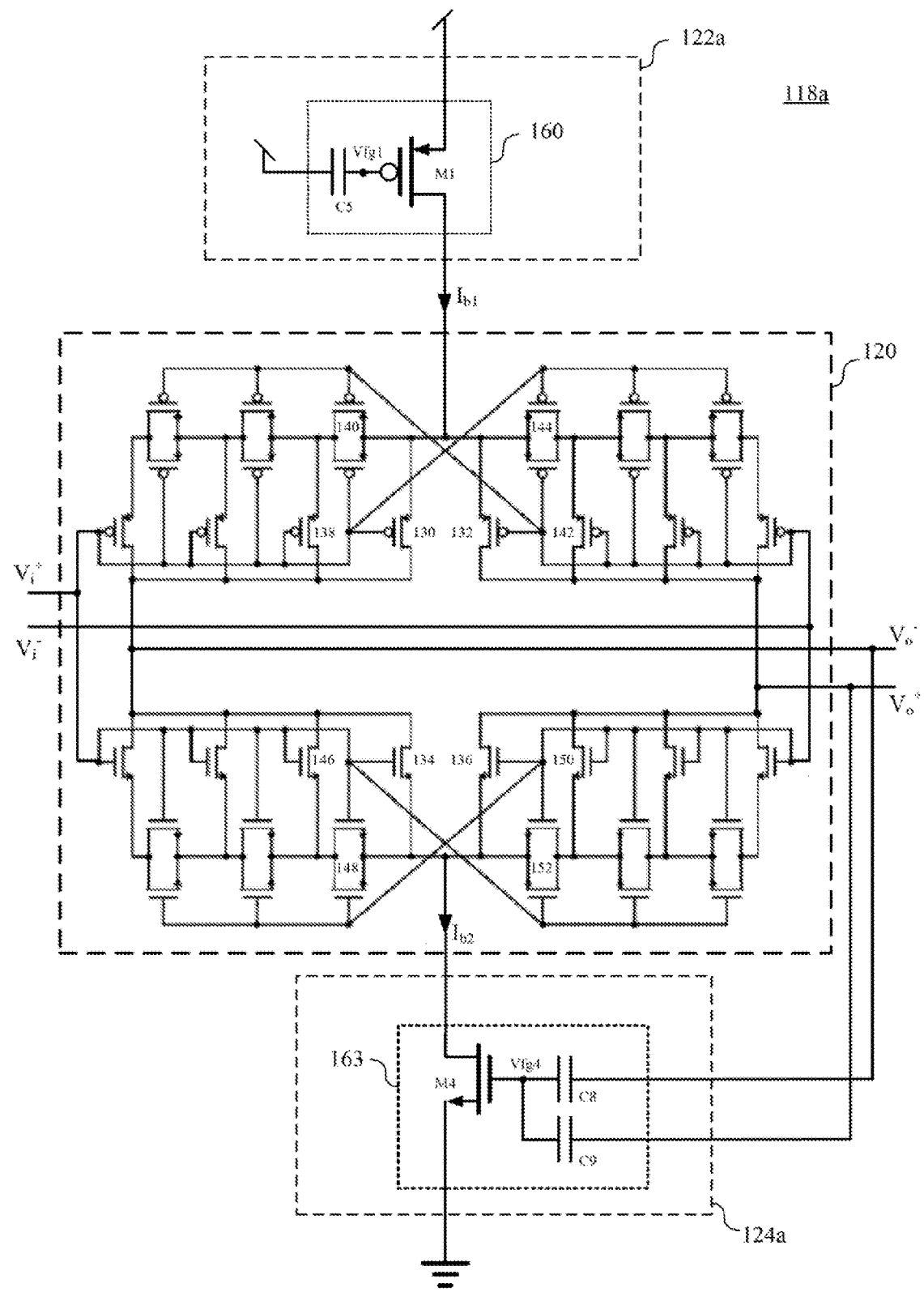
FIG. 6 is a circuit diagram of an operational transconductance amplifier in accordance with one embodiment of the present disclosure.

Reference is now made to FIG. 6. FIG. 6 is a circuit diagram of an operational transconductance amplifier 118a similar to the operational transconductance amplifier 118 illustrated in FIG. 4 in accordance with one embodiment of the present disclosure. The operational transconductance amplifier 118a can be applied in the operational transconductance amplifier 110, 112, 114 or 116 illustrated in FIG. 1 and FIG. 2.

The operational transconductance amplifier 118a includes a fully-differential amplifying circuit 120 as illustrated in FIG. 4, a bias driving circuit 122a and a common mode feedback circuit 124a. The bias driving circuit 122a is shown in the embodiment illustrated in FIG. 5, and hence is not described again herein.

The common mode feedback circuit 124a of the operational transconductance amplifier 118a includes NMOS floating-gate transistor 163. The NMOS floating-gate transistor 163 includes coupling capacitors C8 C9, and a transistor M4. By adjusting the electrical charges stored in the coupling capacitors C8 and C9 of the NMOS floating-gate transistor 163 according to the differential output voltage $V_o^+$ and $V_o^-$, the floating-gate voltage level $V_{fg4}$ of the transistor M4 changes accordingly. Consequently, the second bias current $I_{b2}$ changes accordingly, so that the current values of $I_{b1}$ and $I_{b2}$ are set to be equal and hence the differential output voltage $V_o^+$ and $V_o^-$ is stabilized. Consequently, the transistors of the fully-differential amplifying circuit 120 cork stably within preferred operation regions.

Compared with conventional common mode feedback circuits, in the present disclosure, by utilizing the NMOS floating-gate transistor 163, additional power consumed by conventional common mode feedback circuits is reduced.

It is noted that in FIG. 6, the location of the bias driving circuit 122a and the location of the common mode feedback circuit 124a can be exchanged. In another embodiment of the present disclosure (not depicted), an operational transconductance amplifier is employed with a bias driving circuit which comprises a NMOS floating-gate transistor, and is located under a fully-differential amplifying circuit to provide a second bias current Ib2 to drive the fully-differential amplifying circuit. The operational transconductance amplifier is also employed with a common mode feedback circuit which comprises a PMOS floating-gate transistor, and is located above the fully-differential amplifying circuit to receive the differential output voltage $V_o^+$ and $V_o^-$, and to adjust a first bias current $I_{b1}$ according to the output voltage $V_o^+$ and $V_o^-$, so that the first bias current $I_{b1}$ is equal to the second bias current $I_{b2}$. Consequently, the differential output voltage $V_o^+$ and $V_o^-$ is stabilized and the transistors in the fully-differential amplifying circuit work stably within preferred operation regions.

Figure 7:
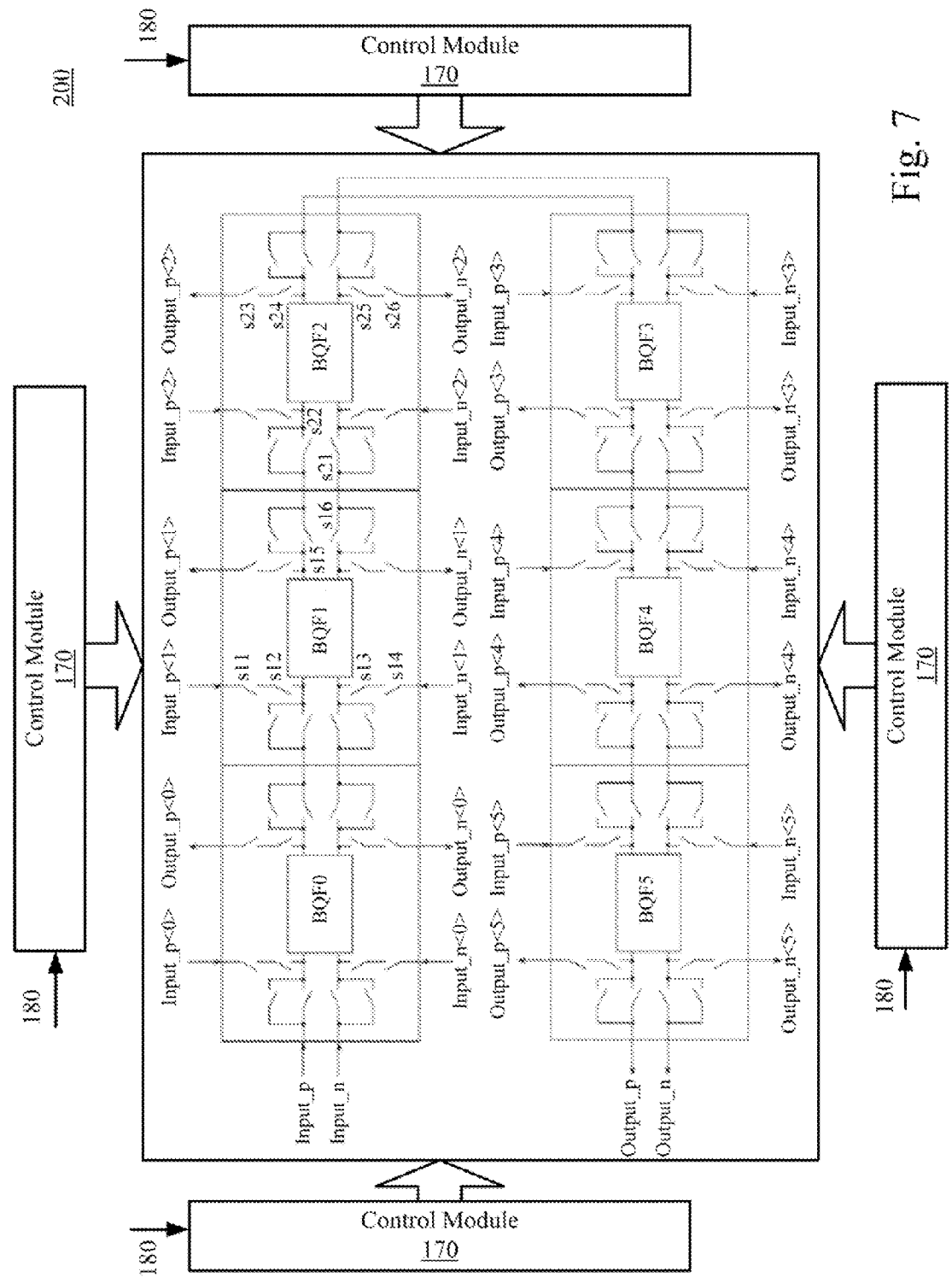
FIG. 7 is a block diagram of a high order filter in accordance with one embodiment of the present disclosure.

Additional reference is also made to FIG. 7. FIG. 7 is a block diagram of a high order filter 200 in accordance with one embodiment of the present disclosure. The high order filter 200 includes six cascadable operational transconductance amplifier-capacitor filters BQF0-BQF5. Each of the operational transconductance amplifier-capacitor filters BQF0-BQF5 can be the operational transconductance amplifier-capacitor filter 100 or 100a illustrated in FIG. 1 and FIG. 2. Input_p, Input_n, Input_p<0>–Input_p<5>, Input_n<0>–Input_n<5> are nodes for inputting differential signals. Output_p, Output_n, Output_p<0>–Output_p<5>, Output_n<0–Output_n<5 are nodes for outputting differential signals.

In the high order filter 200, the connection relationships between the operational transconductance amplifier-capacitor filters BQF0-BQF5 are determined by the switch elements illustrated in FIG. 7. For example, if the switch elements s11-s16 and s21-s26 are closed, a high order filter comprising cascaded operational transconductance amplifier-capacitor filters BQF1 and BQF2 is realized. The high order filter receives a differential input signal Input_p<1> and Input_n<1>, and outputs a differential output signal Input_p<2> and Input_n<2>.

The high order filter 200 further includes a control module 170. The control module 170 is configured for receiving an external signal 180, and for controlling the switch elements illustrated in FIG. 7 according to the external signal 180 to adjust the connection relationships between the operational transconductance amplifier-capacitor filters BQF0-BQF5. In an embodiment of the present disclosure, the external signal 180 is a system instruction, or comes from a memory.

In another embodiment of the present disclosure, each of the operational transconductance amplifier-capacitor filters BQF0-BQF5 is the operational transconductance amplifier-capacitor filter 100 as illustrated in FIG. 1, which comprises four operational transconductance amplifiers 118a as illustrated in FIG. 6. The control module 170 is further configured for respectively configuring the operational transconductance amplifiers 118a of the operational transconductance amplifier-capacitor filters BQF0-BQF5 according to the external signal 180. More specifically, the control module 170 is configured for adjusting the electrical charges stored in the floating gates of the PMOS floating-gate transistor 160 and of the NMOS floating-gate transistor 163 to change the first bias current $I_{b1}$ and the second bias current $I_{b2}$, so that the transconductance value of the operational transconductance amplifiers 118a is adjusted. Consequently, the output gain, the central frequency and the quality factor of the operational transconductance amplifier-capacitor filters BQF0-BQF5 change accordingly.

In another embodiment of the present disclosure, a multiplexer is deployed in each of the operational transconductance amplifier-capacitor filters BQF0-BQF5. The multiplexer is configured for determining whether the differential output voltage of each of the operational transconductance amplifier-capacitor filters BQF0-BQF5 is provided by the operational transconductance amplifier 116 as illustrated in FIG. 1, or by the operational transconductance amplifier 114 as illustrated in FIG. 2. In other words, the multiplexer is configured for determining each of the operational transconductance amplifier-capacitor filters BQF0-BQF5 to be a bandpass filter or a lowpass filter.

In an embodiment of the present disclosure, the control module 170 is further configured for determining each of the operational transconductance amplifier-capacitor filters BQF0-BQF5 to be a bandpass filter or a lowpass filter according to the external signal 180.

It is noted that the number of the operational transconductance amplifier-capacitor filters deployed in the high order filter illustrated in FIG. 7 is not limited to six. Persons skilled in the art can determine the number of the operational transconductance amplifier-capacitor filters deployed according to practical needs. In an embodiment of the present disclosure (not depicted), the structure of a high order filter is similar to the structure of the high order filter illustrated in FIG. 7. The high order filter in that embodiment includes nine cascadable operational transconductance amplifier-capacitor filters.

Compared with prior arts, in the present disclosure, by deploying a plurality of diffusor-differential-pair circuits in the operational transconductance amplifier, the linear range of the operational transconductance amplifier is significantly improved. Consequently, the distortion of the outputted signals is reduced and the dynamic ranges of the operational transconductance amplifiers and of the operational transconductance amplifier-capacitor filter consisting of the operational transconductance amplifiers herein are improved. Moreover, by deploying the bias driving circuit and the common mode feedback circuit consisting of floating-gate transistors, the power consumed by the operational transconductance amplifier is reduced, and the bias driving current provided in this manner is more precise. Consequently, the performance of the operational transconductance amplifier-capacitor filter consisting of the operational transconductance amplifiers herein is improved. Also, the transconductance value of the operational transconductance amplifier can be adjusted by configuring the floating-gate transistors of the bias driving circuit and of the common mode feedback circuit.

Furthermore, by utilizing a reconfigurable circuit, a high order filter is realized by cascading a plurality of operational transconductance amplifier-capacitor filters. In the proposed high order filter, cascadable operational transconductance amplifier-capacitor filters can be selected to be cascaded according to practical needs. The operational transconductance amplifier-capacitor filters which are not selected to be cascaded do not consume power, and each of the operational transconductance amplifier-capacitor filters can comprise the low power and high dynamic range operational transconductance amplifiers proposed in the present disclosure. By adjusting the transconductance values of the operational transconductance amplifiers, the output gain, the central frequency and the quality factor of the operational transconductance amplifier-capacitor filters and of the abovementioned high order filter can be adjusted accordingly.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. An operational transconductance amplifier, comprising:
a fully-differential amplifying circuit, configured for receiving a differential input voltage and for providing a differential output voltage, the fully-differential amplifying circuit comprising a plurality of diffusor-differential-pair circuits, wherein each of the diffusor-differential-pair circuits comprises a first diffusor-differential-pair unit, wherein the first diffusor-differential-pair unit comprises:
- a first diffusor-pair unit comprising a first PMOS transistor and a second PMOS transistor, wherein the source of the first PMOS transistor is electrically connected with the source of the second PMOS transistor, and the drain of the first PMOS transistor is electrically connected with the drain of the second PMOS transistor;
- a second diffusor-pair unit comprising a third PMOS transistor and a fourth PMOS transistor, wherein the source of the third PMOS transistor is electrically connected with the source of the fourth PMOS transistor, and the drain of the third PMOS transistor is electrically connected with the drain of the fourth PMOS transistor; and
- a first differential-pair unit electrically connected with the first diffusor-pair unit and the second diffusor-pair unit;

a bias driving circuit, electrically connected with the fully-differential amplifying circuit, the bias driving circuit being configured for providing at least one first bias current to drive the fully-differential amplifying circuit and adjust the transconductance of the operational transconductance amplifier; and a common mode feedback circuit, electrically connected with the fully-differential amplifying circuit, the common mode feedback circuit being configured for stabilizing the differential output voltage.

2. The operational transconductance amplifier of claim 1, wherein the fully-differential amplifying circuit further comprises a differential-pair circuit.

3. The operational transconductance amplifier of claim 1, wherein the bias driving circuit comprises a first floating-gate transistor, and the first floating-gate transistor is configured for adjusting the first bias current.

4. The operational transconductance amplifier of claim 1, wherein the common mode feedback circuit comprises a second floating-gate transistor and a third floating-gate transistor, and the second floating-gate transistor and the third floating-gate transistor are configured for stabilizing the differential output voltage.

5. The operational transconductance amplifier of claim 1, wherein each of the diffusor-differential-pair circuits further comprises a second diffusor-differential-pair unit, wherein the second diffusor-differential-pair unit is cascode with the first diffusor-differential-pair unit, and the second diffusor-differential-pair unit comprises:
- a third diffusor-pair unit comprising a first NMOS transistor and a second NMOS transistor, wherein the source of the first NMOS transistor is electrically connected with the source of the second NMOS transistor, and the drain of the first NMOS transistor is electrically connected with the drain of the second NMOS transistor;
- a fourth diffusor-pair unit comprising a third NMOS transistor and a fourth NMOS transistor, wherein the source of the third NMOS transistor is electrically connected with the source of the fourth NMOS transistor, and the drain of the third NMOS transistor is electrically connected with the drain of the fourth NMOS transistor; and
- a second differential-pair unit electrically connected with the third diffusor-pair unit and the fourth diffusor-pair unit; and the common mode feedback circuit being further configured for adjusting at least one second bias current of the fully-differential amplifying circuit so that the differential output voltage is stabilized.

6. The operational transconductance amplifier of claim 5, wherein the common mode feedback circuit comprises a fourth floating-gate transistor, and the fourth floating-gate transistor is configured for adjusting the second bias current.

7. An operational transconductance amplifier-capacitor (OTA-C) filter comprising a plurality of electrically connected operational transconductance amplifiers and a plurality of capacitors, wherein each of the operational transconductance amplifiers comprises:
- a fully-differential amplifying circuit, configured for receiving a differential input voltage and for providing a differential output voltage, the fully-differential amplifying circuit comprising a plurality of diffusor-differential-pair circuits, wherein each of the diffusor-differential-pair circuits comprises a first diffusor-differential-pair unit, wherein the first diffusor-differential-pair unit comprises:
  - a first diffusor-pair unit comprising a first PMOS transistor and a second PMOS transistor, wherein the source of the first PMOS transistor is electrically connected with the source of the second PMOS transistor, and the drain of the first PMOS transistor is electrically connected with the drain of the second PMOS transistor;
  - a second diffusor-pair unit comprising a third PMOS transistor and a fourth PMOS transistor, wherein the source of the third PMOS transistor is electrically connected with the source of the fourth PMOS transistor, and the drain of the third PMOS transistor is electrically connected with the drain of the fourth PMOS transistor; and
  - a first differential-pair unit electrically connected with the first diffusor-pair unit and the second diffusor-pair unit;
- a bias driving circuit, electrically connected with the fully-differential amplifying circuit, the bias driving circuit being configured for providing at least one first bias current to drive the fully-differential amplifying circuit and adjust the transconductance of the operational transconductance amplifier; and
- a common mode feedback circuit, electrically connected with the fully-differential amplifying circuit, the common mode feedback circuit being configured for stabilizing the differential output voltage.

8. The operational transconductance amplifier-capacitor filter of claim 7, wherein the fully-differential amplifying circuit further comprises a differential-pair circuit.

9. The operational transconductance amplifier-capacitor filter of claim 7, wherein the bias driving circuit comprises a first floating-gate transistor, and the first floating-gate transistor is configured for adjusting the first bias current.

10. The operational transconductance amplifier-capacitor filter of claim 7, wherein the common mode feedback circuit comprises a second floating-gate transistor and a third floating-gate transistor, and the second floating-gate transistor and the third floating-gate transistor are configured for stabilizing the differential output voltage.

11. The operational transconductance amplifier-capacitor filter of claim 7, wherein each of the diffusor-differential-pair circuits further comprises a second diffusor-differential-pair unit, wherein the second diffusor-differential-pair unit is cascode with the first diffusor-differential-pair unit, and the second diffusor-differential-pair unit comprises:
- a third diffusor-pair unit comprising a first NMOS transistor and a second NMOS transistor, wherein the source of the first NMOS transistor is electrically connected with the source of the second NMOS transistor, and the drain of the first NMOS transistor is electrically connected with the drain of the second NMOS transistor;

a fourth diffusor-pair unit comprising a third NMOS transistor and a fourth NMOS transistor, wherein the source of the third NMOS transistor is electrically connected with the source of the fourth NMOS transistor, and the drain of the third NMOS transistor is electrically connected with the drain of the fourth NMOS transistor; and a second differential-pair unit electrically connected with the third diffusor-pair unit and the fourth diffusor-pair unit; and the common mode feedback circuit being further configured for adjusting at least one second bias current of the fully-differential amplifying circuit so that the differential output voltage is stabilized.

12. The operational transconductance amplifier-capacitor filter of claim 11, wherein the common mode feedback circuit comprises a fourth floating-gate transistor, and the fourth floating-gate transistor is configured for adjusting the second bias current.

13. A high order filter comprises:
a plurality of cascadable operational transconductance amplifier-capacitor filters, each of the operational transconductance amplifier-capacitor filters comprising a plurality of electrically connected operational transconductance amplifiers and a plurality of capacitors, wherein each of the operational transconductance amplifiers comprises;
a fully-differential amplifying circuit, configured for receiving a differential input voltage and for providing a differential output voltage, the fully-differential amplifying circuit comprising a plurality of diffusor-differential-pair circuits, wherein each of the diffusor-differential-pair circuits comprises a first diffusor-differential-pair unit, wherein the first diffusor-differential-pair unit comprises:
a first diffusor-pair unit comprising a first PMOS transistor and a second PMOS transistor, wherein the source of the first PMOS transistor is electrically connected with the source of the second PMOS transistor, and the drain of the first PMOS transistor is electrically connected with the drain of the second PMOS transistor;
a second diffusor-pair unit comprising a third PMOS transistor and a fourth PMOS transistor, wherein the source of the third PMOS transistor is electrically connected with the source of the fourth PMOS transistor, and the drain of the third PMOS transistor is electrically connected with the drain of the fourth PMOS transistor; and
a first differential-pair unit electrically connected with the first diffusor-pair unit and the second diffusor-pair unit;
a bias driving circuit, electrically connected with the fully-differential amplifying circuit, the bias driving circuit being configured for providing at least one first bias current to drive the fully-differential amplifying circuit and adjust the transconductance of the operational transconductance amplifier; and
a common mode feedback circuit, electrically connected with the fully-differential amplifying circuit, the common mode feedback circuit being configured for stabilizing the differential output voltage; and
a control module, configured for controlling the operational transconductance amplifier-capacitor filters to be selectively cascaded according to an external signal.

14. The high order filter of claim 13, wherein the fully-differential amplifying circuit further comprises a differential-pair circuit.

15. The high order filter of claim 13, wherein the bias driving circuit comprises a first floating-gate transistor, and the first floating-gate transistor is configured for adjusting the first bias current.

16. The high order filter of claim 13, wherein the common mode feedback circuit comprises a second floating-gate transistor and a third floating-gate transistor, and the second floating-gate transistor and the third floating-gate transistor are configured for stabilizing the differential output voltage.

17. The high order filter of claim 13, wherein each of the diffusor-differential-pair circuits further comprises a second diffusor-differential-pair unit, wherein the second diffusor-differential-pair unit is cascode with the first diffusor-differential-pair unit, and the second diffusor-differential-pair unit comprises:
a third diffusor-pair unit comprising a first NMOS transistor and a second NMOS transistor, wherein the source of the first NMOS transistor is electrically connected with the source of the second NMOS transistor, and the drain of the first NMOS transistor is electrically connected with the drain of the second NMOS transistor;
a fourth diffusor-pair unit comprising a third NMOS transistor and a fourth NMOS transistor, wherein the source of the third NMOS transistor is electrically connected with the source of the fourth NMOS transistor, and the drain of the third NMOS transistor is electrically connected with the drain of the fourth NMOS transistor; and
a second differential-pair unit electrically connected with the third diffusor-pair unit and the fourth diffusor-pair unit; and
the common mode feedback circuit being further configured for adjusting at least one second bias current of the fully-differential amplifying circuit so that the differential output voltage is stabilized.

* * * * *